(12) United States Patent
Lee et al.

(10) Patent No.: US 11,723,206 B2
(45) Date of Patent: Aug. 8, 2023

(54) SEMICONDUCTOR MEMORY DEVICE AND METHODS OF MANUFACTURING AND OPERATING THE SAME

(71) Applicant: SK hynix Inc., Icheon-si (KR)

(72) Inventors: Dong Uk Lee, Icheon-si (KR); Hae Chang Yang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/898,932

(22) Filed: Aug. 30, 2022

(65) Prior Publication Data

US 2022/0415921 A1    Dec. 29, 2022

Related U.S. Application Data

(62) Division of application No. 17/174,171, filed on Feb. 11, 2021, now Pat. No. 11,462,566.

(30) Foreign Application Priority Data

Aug. 25, 2020 (KR) .......................... 10-2020-0107387

(51) Int. Cl.
*G11C 16/04*    (2006.01)
*H10B 43/27*    (2023.01)
(Continued)

(52) U.S. Cl.
CPC ......... *H10B 43/27* (2023.02); *G11C 13/0004* (2013.01); *G11C 13/0069* (2013.01);
(Continued)

(58) Field of Classification Search
CPC ........ H10B 43/27; H10B 41/27; H10B 63/34; H10B 63/845; H10B 43/35;
(Continued)

(56) References Cited

U.S. PATENT DOCUMENTS

| 9,734,913 B2 | 8/2017 | Lee et al. |
| 2008/0112211 A1 | 5/2008 | Toda |

(Continued)

FOREIGN PATENT DOCUMENTS

| EP | 1256986 A2 | 11/2002 |
| JP | 4265817 B1 | 5/2009 |

(Continued)

OTHER PUBLICATIONS

Dong Uk Lee et. al., Low operation voltage and high thermal stability of a WSi2 nanocrystal memory device using an Al2O3/HfO2/Al2O3 tunnel layer, Applied Physics Letters 100, 072901, Feb. 13, 2012, American Institute of Physics.

(Continued)

*Primary Examiner* — Hien N Nguyen
(74) *Attorney, Agent, or Firm* — William Park & Associates Ltd.

(57) ABSTRACT

A semiconductor memory device and methods of manufacturing and operating the same are set forth. The semiconductor memory device includes a stack structure including a plurality of interlayer insulating layers and a plurality of gate electrodes, which may be alternately stacked on a substrate, and a plurality of channel structures penetrating the stack structure in a vertical direction. Each of the plurality of channel structures includes a channel layer, a tunnel insulating layer, an emission preventing layer, and a charge storage layer, each of which vertically extends toward the substrate.

11 Claims, 15 Drawing Sheets

(51) Int. Cl.
  *G11C 16/10* (2006.01)
  *G11C 13/00* (2006.01)
  *H10B 41/27* (2023.01)
  *H10B 63/00* (2023.01)
  *H10N 70/20* (2023.01)

(52) U.S. Cl.
  CPC .......... *G11C 16/0483* (2013.01); *G11C 16/10* (2013.01); *H10B 41/27* (2023.02); *H10B 63/34* (2023.02); *H10B 63/845* (2023.02); *H10N 70/231* (2023.02); *G11C 2213/75* (2013.01)

(58) Field of Classification Search
  CPC ............ G11C 13/0004; G11C 13/0069; G11C 16/0483; G11C 16/10; G11C 2213/75; G11C 16/24; H10N 70/231; H10N 70/011; H10N 70/25; H10N 70/823; H10N 70/8833; H10N 70/8836; H01L 29/40117; H01L 29/1033
  See application file for complete search history.

(56) References Cited

U.S. PATENT DOCUMENTS

| | | |
|---|---|---|
| 2011/0266611 A1 | 11/2011 | Kim et al. |
| 2013/0334488 A1 | 12/2013 | Park |
| 2014/0131716 A1 | 5/2014 | Shieh et al. |
| 2014/0312295 A1* | 10/2014 | Yasutake ............ H10N 70/8828 257/4 |
| 2015/0340610 A1 | 11/2015 | Jung et al. |
| 2017/0373119 A1* | 12/2017 | Oga ........................ H10B 63/34 |
| 2019/0272878 A1 | 9/2019 | Lee |
| 2022/0093621 A1* | 3/2022 | Lee ..................... H01L 23/5226 |
| 2022/0319602 A1* | 10/2022 | Lee ................... H01L 29/40117 |

FOREIGN PATENT DOCUMENTS

| | | |
|---|---|---|
| KR | 1020100093350 A | 8/2010 |
| KR | 1020160009299 A | 1/2016 |
| KR | 1020180081956 A | 7/2018 |
| WO | 2008087692 A1 | 7/2008 |

OTHER PUBLICATIONS

J. Razafindramora et al., Low voltage hot-carrier programming of ultra-scaled SOI Finflash memories, p. 414-417, 37th European Solid State Device Research Conference, IEEE, ESSDERC 2007.

Wei-Hao Hsiao et al., Modeling of Apparent Activation Energy and Lifetime Estimation for Retention of 3D SGVC Memory, IEEE IRPS, 2019.

* cited by examiner

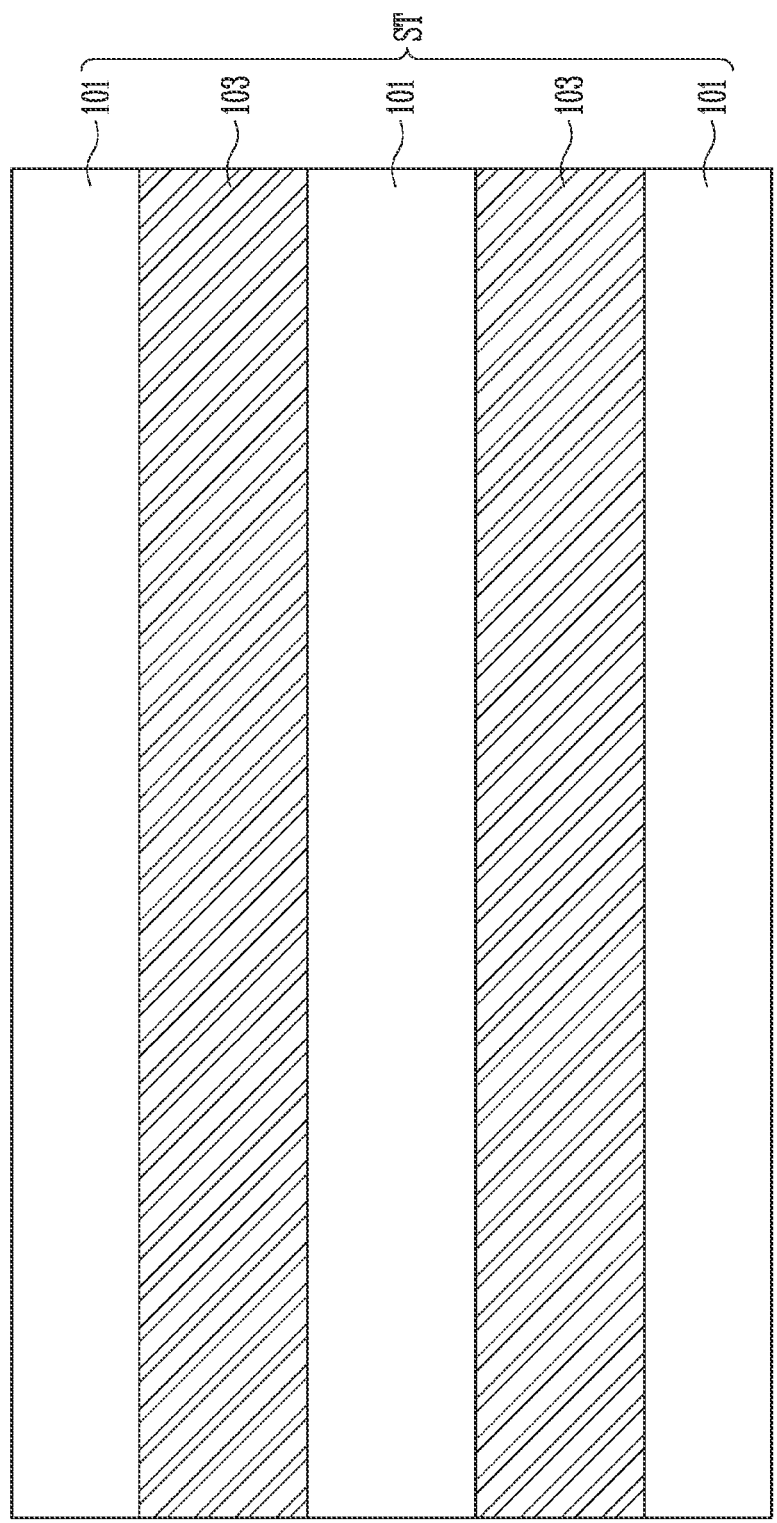

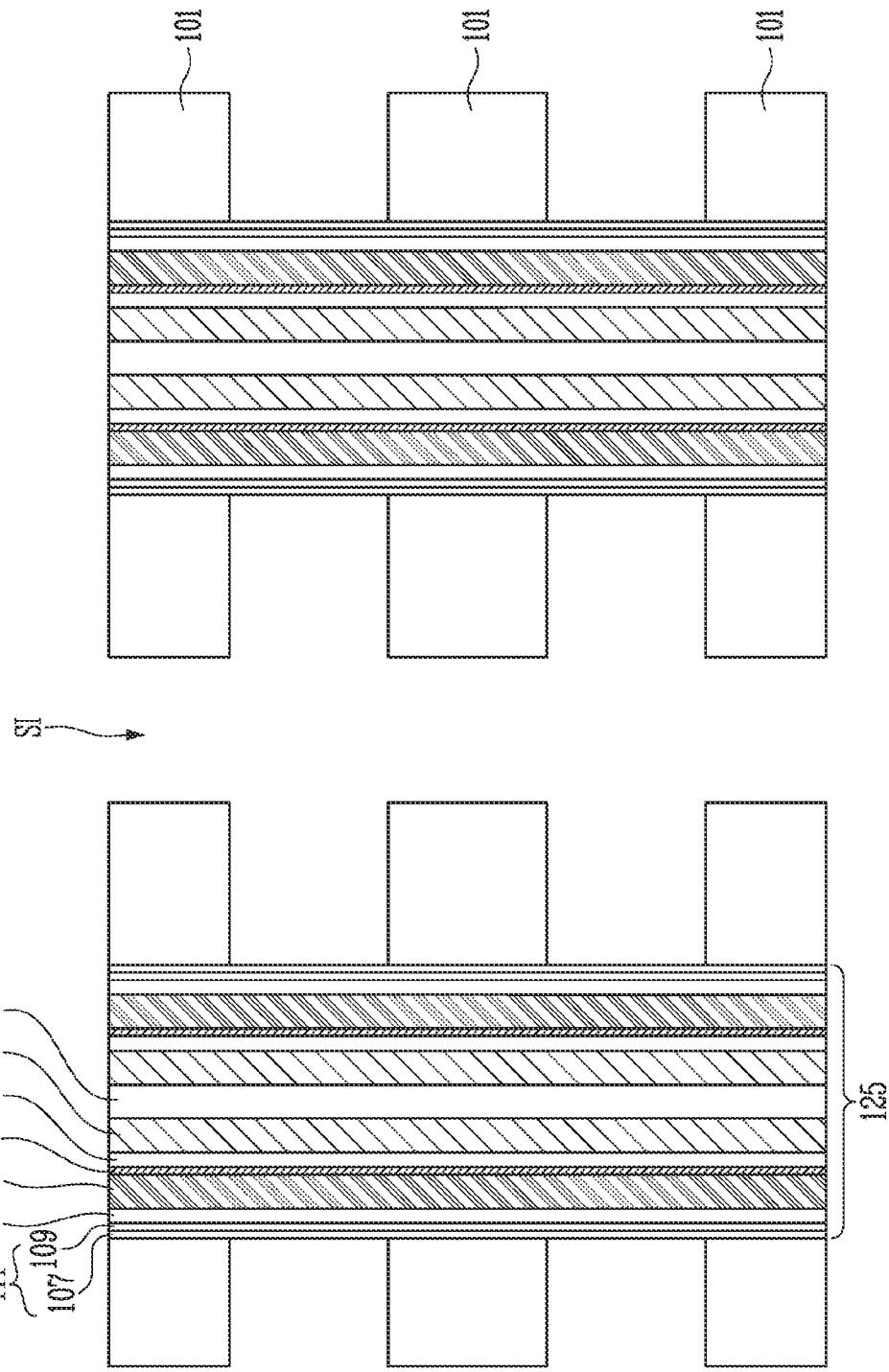

SEMICONDUCTOR MEMORY DEVICE AND METHODS OF MANUFACTURING AND OPERATING THE SAME

CROSS-REFERENCE TO RELATED APPLICATION

The present application is a divisional application of U.S. patent application Ser. No. 17/174,171, filed on Feb. 11, 2021, and claims priority under 35 U.S.C. § 119(a) to Korean patent application number 10-2020-0107387 filed on Aug. 25, 2020, in the Korean Intellectual Property Office, the entire disclosure of which is incorporated by reference herein.

BACKGROUND

1. Technical Field

The present disclosure generally relates to an electronic device, and more particularly, to a semiconductor memory device and methods of manufacturing and operating the same.

RELATED ART

The paradigm on recent computer environment has been turned into a ubiquitous computing environment in which computing systems may be used anywhere and anytime. This promotes increasing usage of portable electronic devices such as mobile phones, digital cameras, notebook computers, and the like. Such portable electronic devices may generally include a memory system using a semiconductor memory device, i.e., a data storage device. The data storage device may be used as a main memory device or as an auxiliary memory device of the portable electronic devices.

A data storage device using a semiconductor memory device has excellent stability and durability, high information access speed, and low power consumption since there is no mechanical driving part. In an example of memory systems having such advantages, the data storage device may include a Universal Serial Bus (USB) memory device, memory cards having various interfaces, a Solid State Drive (SSD), and the like.

The semiconductor memory device may be generally classified as either a volatile memory device or a nonvolatile memory device.

The nonvolatile memory device may have relatively slow write and read speeds, but may retain stored data even when the supply of power is interrupted. Thus, the nonvolatile memory device may be used to store data to be retained regardless of whether power is supplied. Examples of the volatile memory may include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory may be classified as a NOR type flash memory or a NAND type flash memory.

SUMMARY

In accordance with an aspect of the present disclosure, a semiconductor memory device may include: a stack structure including a plurality of interlayer insulating layers and a plurality of gate electrodes, which are alternately stacked on a substrate; and a plurality of channel structures penetrating the stack structure in a vertical direction, wherein each of the plurality of channel structures may include a channel layer, a tunnel insulating layer, an emission preventing layer, and a charge storage layer, each of which vertically extends toward the substrate.

In accordance with another aspect of the present disclosure, a method of manufacturing a semiconductor memory device may include: forming a stack structure by alternately stacking a plurality of interlayer insulating layers and a plurality of sacrificial layers on a substrate; forming a plurality of holes penetrating the stack structure in a vertical direction; and sequentially forming a blocking insulating layer, a charge storage layer, an emission preventing layer, a tunnel insulating layer, and a channel layer on a sidewall of each of the plurality of holes.

In accordance with still another aspect of the present disclosure, a method of operating a semiconductor memory device may include: performing a program operation on a plurality of memory cells, each including a channel layer, a tunnel insulating layer, an emission preventing layer, a charge storage layer, a blocking insulating layer, and a compensation charge storage layer, in response to a program command; suspending the program operation in response to a suspend command received from outside of the semiconductor memory device, and applying, during a suspend period, a positive voltage to bit lines or a source line, wherein the bit lines or the source line is connected to the memory cells; and re-performing the suspended program operation in response to a resume command received from outside of the semiconductor memory device.

BRIEF DESCRIPTION OF THE DRAWINGS

Example embodiments will now be described more fully hereinafter with reference to the accompanying drawings; however, the present disclosure may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element may be referred to as being "between" two elements, it may be the only element between the two elements, or one or more intervening elements may also be present. Like reference numerals may refer to like elements throughout.

FIGS. 6A to 6D are sectional views illustrating a method of manufacturing a memory cell array in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure may be implemented in various forms and may not be construed as limited to the embodiments set forth herein.

Hereinafter, exemplary embodiments of the present disclosure will be described in detail with reference to the accompanying drawings in order for those skilled in the art to be able to readily implement the technical spirit of the present disclosure.

Embodiments may provide a semiconductor memory device that may improve a threshold voltage distribution by suppressing charges trapped in a charge storage layer of a memory cell such that the charges are not emitted within a limited time in a program operation of the semiconductor memory device. Embodiments may also include methods of manufacturing and operating the semiconductor memory device.

Figure 1:
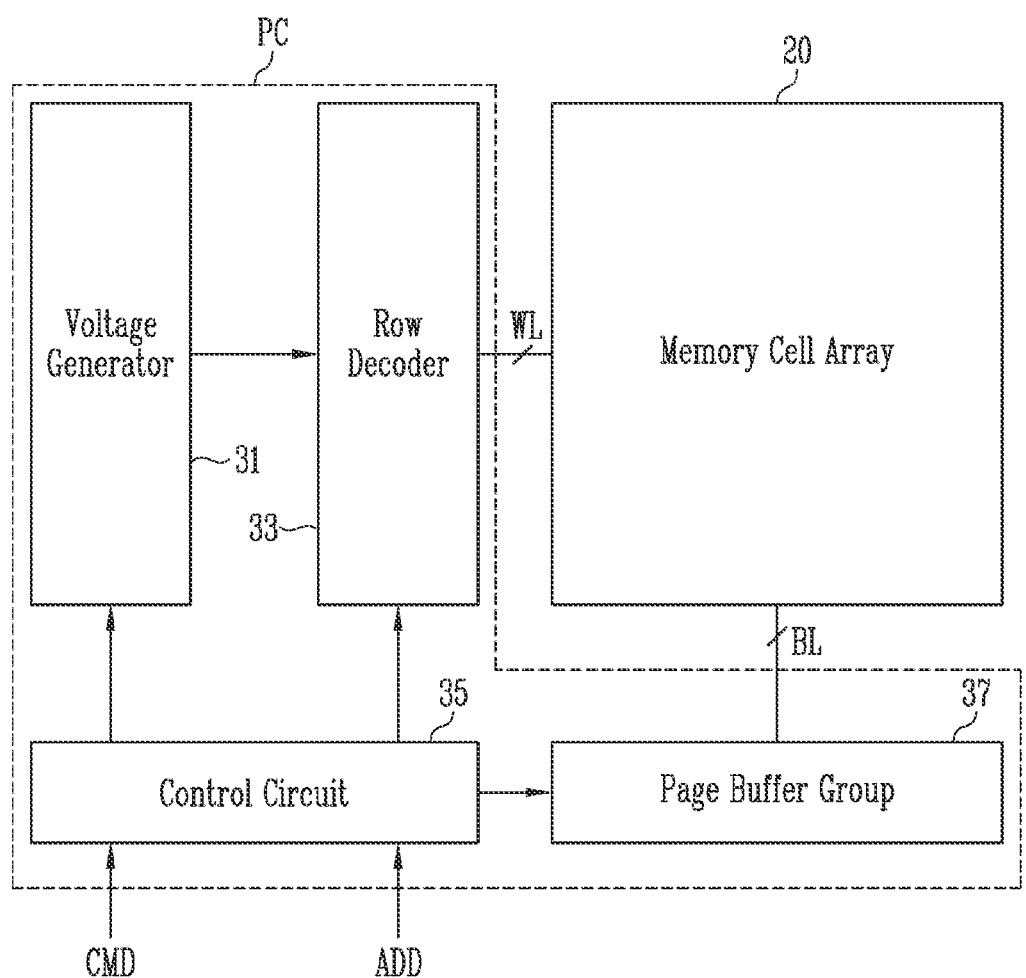
FIG. 1 is a block diagram illustrating a semiconductor memory device in accordance with an embodiment of the present disclosure.

FIG. 1 is a block diagram illustrating a semiconductor memory device in accordance with an embodiment of the present disclosure.

Referring to FIG. 1, the semiconductor memory device 10 may include a peripheral circuit PC and a memory cell array 20.

The peripheral circuit PC may be configured to control a program operation for storing data to the memory cell array 20, a read operation for outputting data stored in the memory cell array 20, and an erase operation for erasing data stored in the memory cell array 20.

In an embodiment, the peripheral circuit PC may include a voltage generator 31, a row decoder 33, a control circuit 35, and a page buffer group 37.

The memory cell array 20 may include a plurality of memory blocks. The memory cell array 20 may be connected to the row decoder 33 through word lines WL, and may be connected to the page buffer group 37 through bit lines BL.

The control circuit 35 may control the peripheral circuit PC in response to a command CMD and an address ADD.

The voltage generator 31 may generate various operating voltages such as a pre-erase voltage, an erase voltage, a ground voltage, a program voltage, a verify voltage, a pass voltage, and a read voltage, which may be used for a program operation, a read operation, and an erase operation, under the control of the control circuit 35.

The row decoder 33 may select a memory block under the control of the control circuit 35. The row decoder 33 may apply operating voltages to the word lines WL connected to the selected memory block.

The page buffer group 37 may be connected to the memory cell array 20 through the bit lines BL. The page buffer group 37 may temporarily store data received from an input/output circuit (not shown) in a program operation under the control of the control circuit 35. The page buffer group 37 may sense a voltage or current of the bit lines BL in a read operation or a verify operation under the control of the control circuit 35. The page buffer group 37 may select the bit lines BL under the control of the control circuit 35.

Structurally, the memory cell array 20 may overlap with a portion of the peripheral circuit PC.

Figure 2:
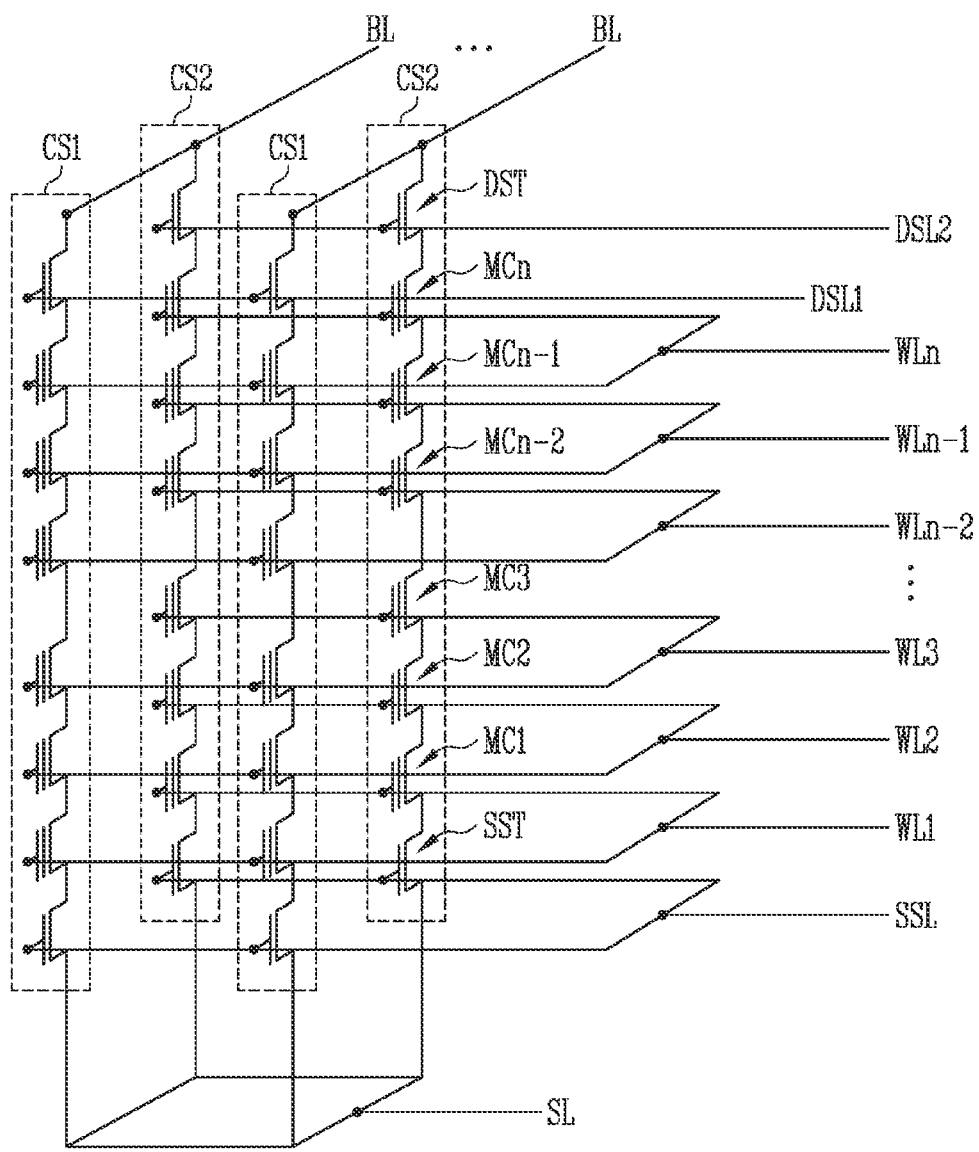
FIG. 2 is a circuit diagram illustrating a memory cell array shown in FIG. 1.

FIG. 2 is a circuit diagram illustrating the memory cell array shown in FIG. 1.

Referring to FIG. 2, the memory cell array 20 may include a plurality of cell strings CS1 and CS2 connected between a source line SL and a plurality of bit lines BL, The plurality of cell strings CS1 and CS2 may be commonly connected to a plurality of word lines WL1 to WLn.

Each of the plurality of cell strings CS1 and CS2 may include at least one source select transistor SST connected to the source line SL, at least one drain select transistor DST connected to the bit line BL, and a plurality of memory cells MC1 to MCn connected in series between the source select transistor SST and the drain select transistor DST.

Gates of the plurality of memory cells MC1 to MCn may be connected, respectively, to the plurality of word lines WL1 to WLn stacked to be spaced apart from each other, Two or more drain select lines DSL1 and DSL2 may be spaced apart from each other at a same level.

A gate of the source select transistor SST may be connected to a source select line SSL. A gate of the drain select transistor DST may be connected to a drain select line corresponding to the gate of the drain select transistor DST.

The source line SL may be connected to a source of the source select transistor SST. A drain of the drain select transistor DST may be connected to a bit line corresponding to the drain of the drain select transistor DST.

The plurality of cell strings CS1 and CS2 may be divided into string groups connected, respectively, to the two or more drain select lines DSL1 and DSL2. Cell strings connected to the same word line and the same bit line may be independently controlled by different drain select lines. Also, cell strings connected to the same drain select line may be independently controlled by different bit lines.

In an embodiment, the two or more drain select lines DSL1 and DSL2 may include a first drain select line DSL1 and a second drain select line DSL2. The plurality of cell strings CS1 and CS2 may include a first cell string CS1 of a first cell string group connected to the first drain select line Dal and a second cell string CS2 of a second string group connected to the second drain select line DSL2.

Figure 3A:
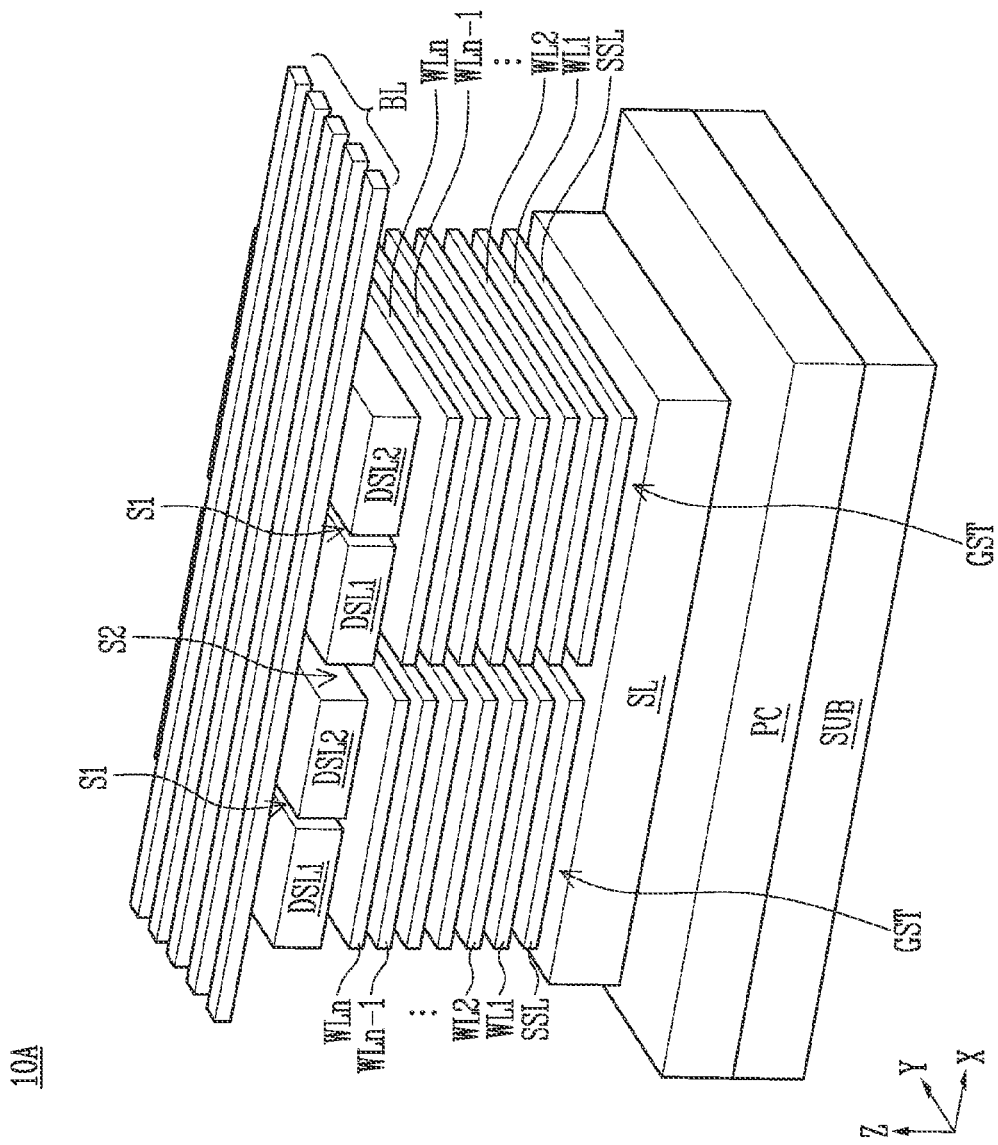
FIGS. 3A and 3B are perspective views schematically illustrating semiconductor memory devices in accordance with embodiments of the present disclosure.
Figure 3B:
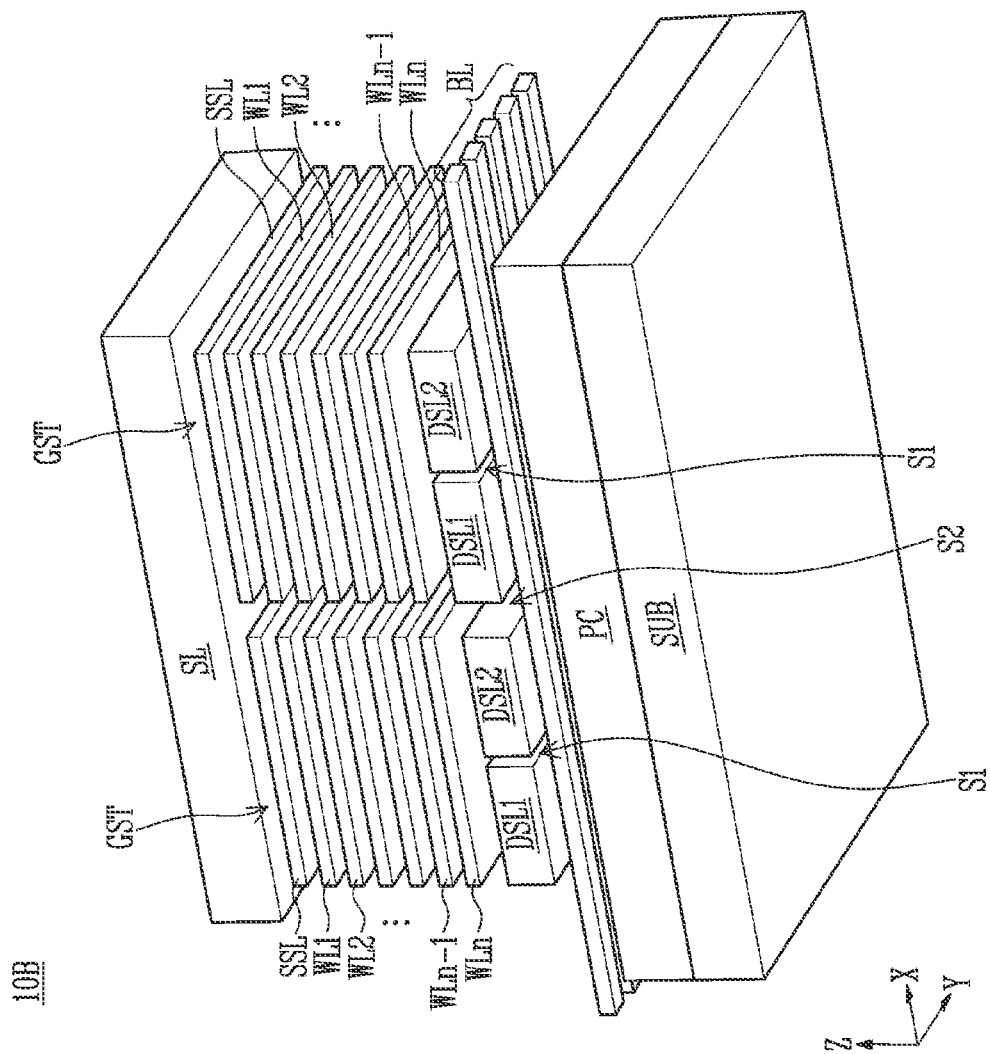

FIGS. 3A and 3B are perspective views schematically illustrating semiconductor memory devices in accordance with embodiments of the present disclosure.

Referring to FIGS. 3A and 3B, each of the semiconductor memory devices 10A and 106 may include a peripheral circuit PC disposed on the substrate SUB and gate stack structures GST overlapping with the peripheral circuit PC.

Each of the gate stack structures GST may include a source select line SSL, a plurality of word lines WL1 to WLn, and two or more drain select lines DSL1 and DSL2 isolated from each other at a same level by a first slit S1.

The source select line SSL and the plurality of word lines WL1 to WLn may be formed in a plate shape which may expand in a first direction X and a second direction Y and may be parallel to a top surface of the substrate SUB. The first direction X may be a direction in which an X-axis faces in an XYZ coordinate system, and the second direction Y may be a direction in which a Y-axis faces in the XYZ coordinate system.

The plurality of word lines WL1 to WLn may be stacked to be spaced apart from each other in a third direction Z. The third direction Z may be a direction in which a Z-axis faces in the XYZ coordinate system. The plurality of word lines WL1 to WLn may be disposed between the two or more drain select lines Dal and DSL2 and the source select line SSL.

The gate stack structures GST may be isolated from each other by a second slit S2. The first slit S1 may be formed shorter than the second slit S2 in the third direction Z, and may overlap with the plurality of word lines WL1 to WLn.

Each of the first slit S1 and the second slit S2 may extend in a linear shape, extend in a zigzag shape, or extend in a wave form, A width of each of the first slit S1 and the second slit S2 may be variously changed according to a design rule.

Referring to FIG. 3A, in accordance with an embodiment, the source select line SSL may be disposed closer to the peripheral circuit PC than the two or more drain select lines DSL1 and DSL2.

The semiconductor memory device 10A may include a source line SL disposed between the gate stack structure GST and the peripheral circuit PC and a plurality of bit lines BL spaced more apart from the peripheral circuit PC than the source line SL. The gate stack structures GST may be disposed between the plurality of bit lines BL and the source line SL.

Referring to FIG. 3B, in accordance with an embodiment, the two or more drain select lines DSL1 and DSL2 may be disposed closer to the peripheral circuit PC than to the source select line SSL.

The semiconductor memory device 10B may include a plurality of bit lines BL disposed between the gate stack structures GST and the peripheral circuit PC and a source line SL that is disposed further from the peripheral circuit PC than from the plurality of bit lines BL. The gate stack structures GST may be disposed between the plurality of bit lines BL and the source line SL.

Referring back to FIGS. 3A and 3B, the plurality of bit lines BL may be formed of various conductive materials. The source line SL may include a doped semiconductor layer. In an example, the source line SL may include an n-type doped silicon layer.

Although not shown in the drawings, the peripheral circuit PC may be electrically connected to the plurality of bit lines BL, the source line SL, and the plurality of word lines WL1 to WLn through interconnections having various structures.

Figure 4:
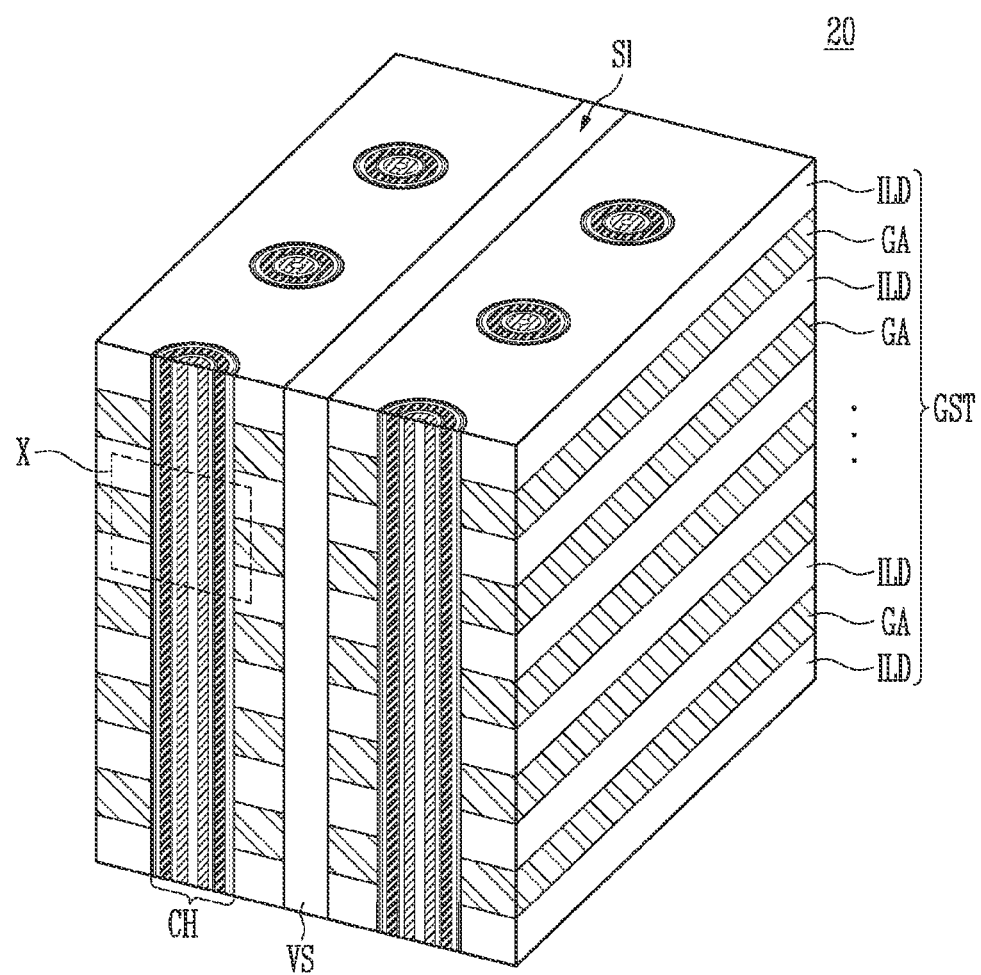
FIG. 4 is a perspective view illustrating a portion of a memory cell array of a semiconductor memory device in accordance with an embodiment of the present disclosure.

FIG. 4 is a perspective view illustrating a portion of a memory cell array of a semiconductor memory device in accordance with an embodiment of the present disclosure.

Referring to FIG. 4, the memory cell array 20 may include gate stack structures GST isolated from each other by a slit SI and channel structures CH penetrating each of the gate stack structures GST.

The slit SI may be filled with a vertical structure VS. In an embodiment, the vertical structure VS may include art insulating material.

Each of the gate stack structures GST may include interlayer insulating layers ILD and gate electrodes GA, which may be alternately stacked in one direction. Hereinafter, a direction in which the interlayer insulating layers ILD and the gate electrodes GA may be alternately stacked may be referred to as a stacking direction.

The gate electrodes GA may include at least one of a doped semiconductor, a metal, a metal silicide, and a metal nitride layer. Each of the gate electrodes GA may be used as a gate electrode of a memory cell or a gate electrode of a select transistor.

Figure 5:
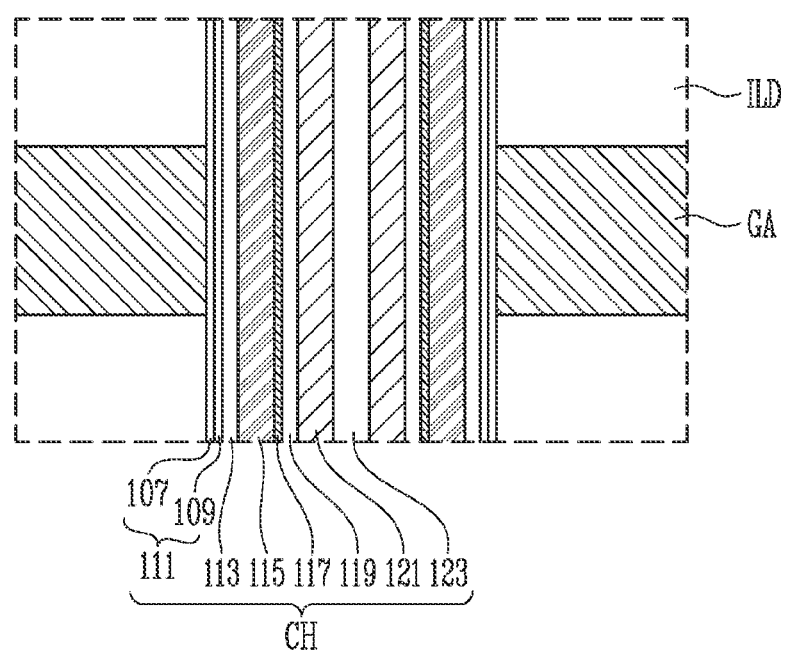
FIG. 5 is an enlarged sectional view illustrating region X shown in FIG. 4.

The channel structure CH may extend in the stacking direction, and may be surrounded by the gate electrodes GA, FIG. 5 is an enlarged sectional view illustrating region X shown in FIG. 4.

Referring to FIG. 5, the channel structure CH may include a compensation charge storage layer 111, a blocking insulating layer 113, a charge storage layer 115, an emission preventing layer 117, a tunnel insulating layer 119, and a channel layer 121, each of which extend in a vertical direction.

The channel layer 121 may be used as a channel region of a cell string. The channel layer 121 may include a semiconductor layer. In an embodiment, the channel layer 121 may include silicon.

The tunnel insulating layer 119 may surround a sidewall of the channel layer 121. The tunnel insulating layer 119 may be formed as a silicon oxide layer through which charges may tunnel.

The emission preventing layer 117 may surround a sidewall of the tunnel insulating layer 119, The emission preventing layer 117 may be formed as a quantum dot monolayer. The emission preventing layer 117 may trap charges that may be released from the charge storage layer 115.

The charge storage layer 115 may surround a sidewall of the emission preventing layer 117. The charge storage layer 115 may be formed as a material layer capable of storing data changed using Fowler-Nordheim tunneling. In an embodiment, the charge storage layer 115 may be formed as a charge trap nitride layer.

The blocking insulating layer 113 may surround a sidewall of the charge storage layer 115. The blocking insulating layer 113 may include an oxide layer capable of blocking charges.

The compensation charge storage layer 111 may surround a sidewall of the blocking insulating layer. The compensation charge storage layer 111 may trap charges introduced from the gate electrode GA. The compensation charge storage layer 111 may be formed as a mufti-layer. In an embodiment, the compensation charge storage layer 111 may be configured with a first layer 109 surrounding the sidewall of the blocking insulating layer 113 and a second layer 107 surrounding a sidewall of the first layer 109. The first layer 109 may be a region in which no trap exists, and the second layer 107 may be a region in which a trap exists. In an embodiment, the compensation charge storage layer 111 may be formed of a high-K material such as $Al_2O_3$, HfO, ZrO, $Ta_2O_3$, HflaxOy, LaHfO or HfSiO.

The channel structure CH may further include a core insulating layer 123 extending in the vertical direction at the inside of the channel layer 121.

In accordance with the embodiment of the present disclosure, a memory cell may include the channel layer 121, and the tunnel insulating layer 119, the emission preventing layer 117, the charge storage layer 115, the blocking insulating layer 113, and the compensation charge storage layer 111, which may be sequentially stacked on the channel layer 121. For example, the channel layer 121, the tunnel insulating layer 119, the emission preventing layer 117, the charge storage layer 115, the blocking insulating layer 113, and the compensation charge storage layer 111, which may be formed in a sidewall region of one gate electrode GA, may be components included in one memory cell.

The semiconductor memory device shown in FIGS. 4 and 5 may be applied to the semiconductor memory device 10A shown in FIG. 3A. The semiconductor memory device shown in FIGS. 4 and 5 may be vertically reversed to be applied to the semiconductor memory device 10B shown in FIG. 3B.

FIGS. 6A to 6D are sectional views illustrating a method of manufacturing a memory cell array in accordance with an embodiment of the present disclosure.

Referring to FIG. 6A, a stack structure ST may be formed such that interlayer insulating layers 101 and sacrificial layers 103 are alternately stacked. The stack structure ST may be formed on a substrate (not shown) including a peripheral circuit.

The sacrificial layer 103 may be formed of a material different from that of the interlayer insulating layers 101, For example, the interlayer insulating layers 101 may be formed of an oxide such as a silicon oxide layer. The sacrificial layers 103 may be formed of a material having an etching rate different from that of the interlayer insulating layers 101. For example, the sacrificial layers 103 may be formed of a nitride such as a silicon nitride layer.

Figure 6B:
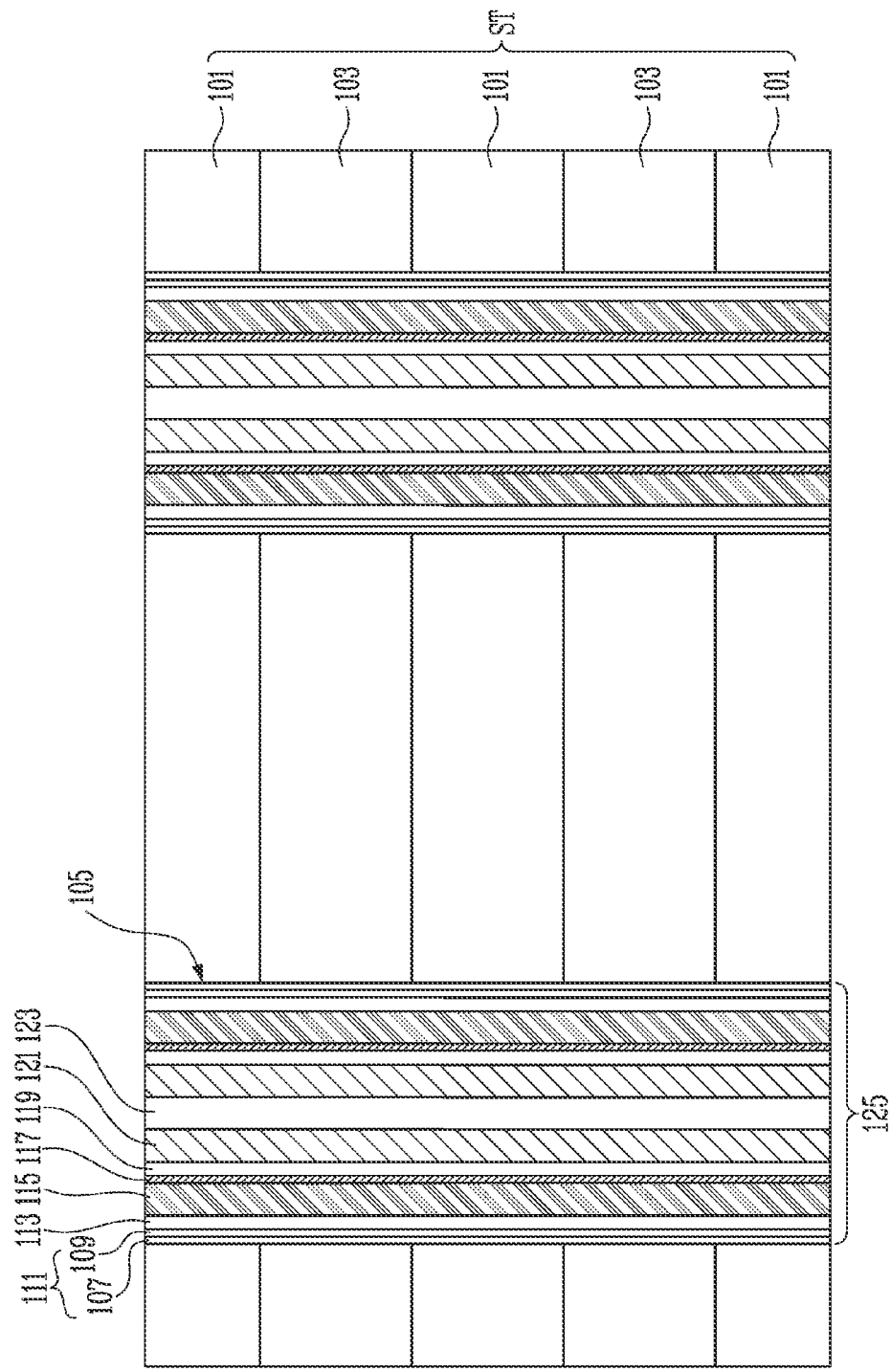

Referring to FIG. 6B, holes 105 may be formed, which penetrate the stack structure ST. Subsequently, a compensation charge storage layer 111, a blocking insulating layer 113, a charge storage layer 115, an emission preventing layer 117, a tunnel insulating layer 119, and a channel layer 121 may be sequentially formed on sidewalls of the holes 105.

In an embodiment, the compensation charge storage layer 111 may be formed as a multi-layer. For example, the compensation charge storage layer 111 may include a second layer 107 formed on the sidewall of the hole 105 and a first layer 109 formed on a sidewall of the second layer 107. The first layer 109 may be a region in which no trap exists, and the second layer 107 may be a region in which a trap exists. The first layer 109 and the second layer 107 may be formed of $Al_2O_3$, and a trap may be formed through a redox mechanism by adjusting a composition ratio of Al and O in a process of forming the second layer 107, The compensation charge storage layer 111 may be formed of a high-K material such as $Al_2O_3$, HfO, ZrO, $Ta_2O_3$, HfTaxOy, LaHfO or HfSiO, For example, the compensation charge storage layer 111 may include a layer including at least one of $Al_2O_3$, HfO, ZrO, $Ta_2O_3$, HfTaxOy, LaHfO, and HfSiO.

The charge storage layer 115 may be formed as a charge trap layer, be formed as a material layer including a conductive nano dot, or be formed as a phase change material layer. For example, the charge storage layer 115 may store data changed using Fowler-Nordheim tunneling, To this end, the charge storage layer 115 may be formed as a silicon nitride layer in which charges may be trapped.

The emission preventing layer 117 may be formed as a quantum dot monolayer. The emission preventing layer 117 may trap charges released from the charge storage layer 115. The emission preventing layer 117 may be formed as a metal silicide layer. For example, the emission preventing layer 117 may be formed by sequentially depositing a tungsten thin film of 3 nm or less and a silicon thin film of 2 nm or less on a sidewall of the charge storage layer 115 and then performing a metal heat treatment process (RTA) of 700° C. or higher. The density and size of quantum dots of the emission preventing layer 117 may be adjusted according to the grain size of tungsten and the degree of reaction to silicon. In another embodiment, the emission preventing layer 117 may be formed by depositing a tungsten silicide ($WSi_2$) layer on the sidewall of the charge storage layer 115 through a CVD or ALD process and then performing a metal heat treatment process (RTA) of 700° C. or higher.

In another embodiment, the emission preventing layer 117 may be formed as a silicon layer. For example, a non-uniform Si quantum dot layer having a size of 2 to 5 nm may be formed by forming an $SiO_2$ layer of 10 nm or less or an $SiO_2$ or SiON layer containing excess Si and then performing a metal heat treatment process (RTA) of 700° C. or higher under an $N_2$ atmosphere.

The tunnel insulating layer 119 may be formed as a silicon oxide layer through which charges may tunnel. The channel layer 121 may include a semiconductor layer. In an embodiment, the channel layer 121 may include silicon. When central regions of the holes 105 are opened by the channel layer 121, the central regions of the holes 105 may be filled with a core insulating layer 123.

Accordingly, a channel structure 125 that includes the compensation charge storage layer 111, the blocking insulating layer 113, the charge storage layer 115, the emission preventing layer 117, the tunnel insulating layer 119, the channel layer 121, and the core insulating layer 123 may be formed to penetrate the stack structure ST.

Referring to FIG. 6C, a slit SI may be formed and may penetrate the stack structure ST, Sidewalls of the sacrificial layers 103 shown in FIG. 6B may be exposed by the slit SI. Subsequently, the sacrificial layers 103 shown in FIG. 6B may be removed through the slit SI. Accordingly, openings may be formed which expose a side portion of the compensation charge storage layer 111. The openings may be defined between the interlayer insulating layers 101.

Figure 6D:
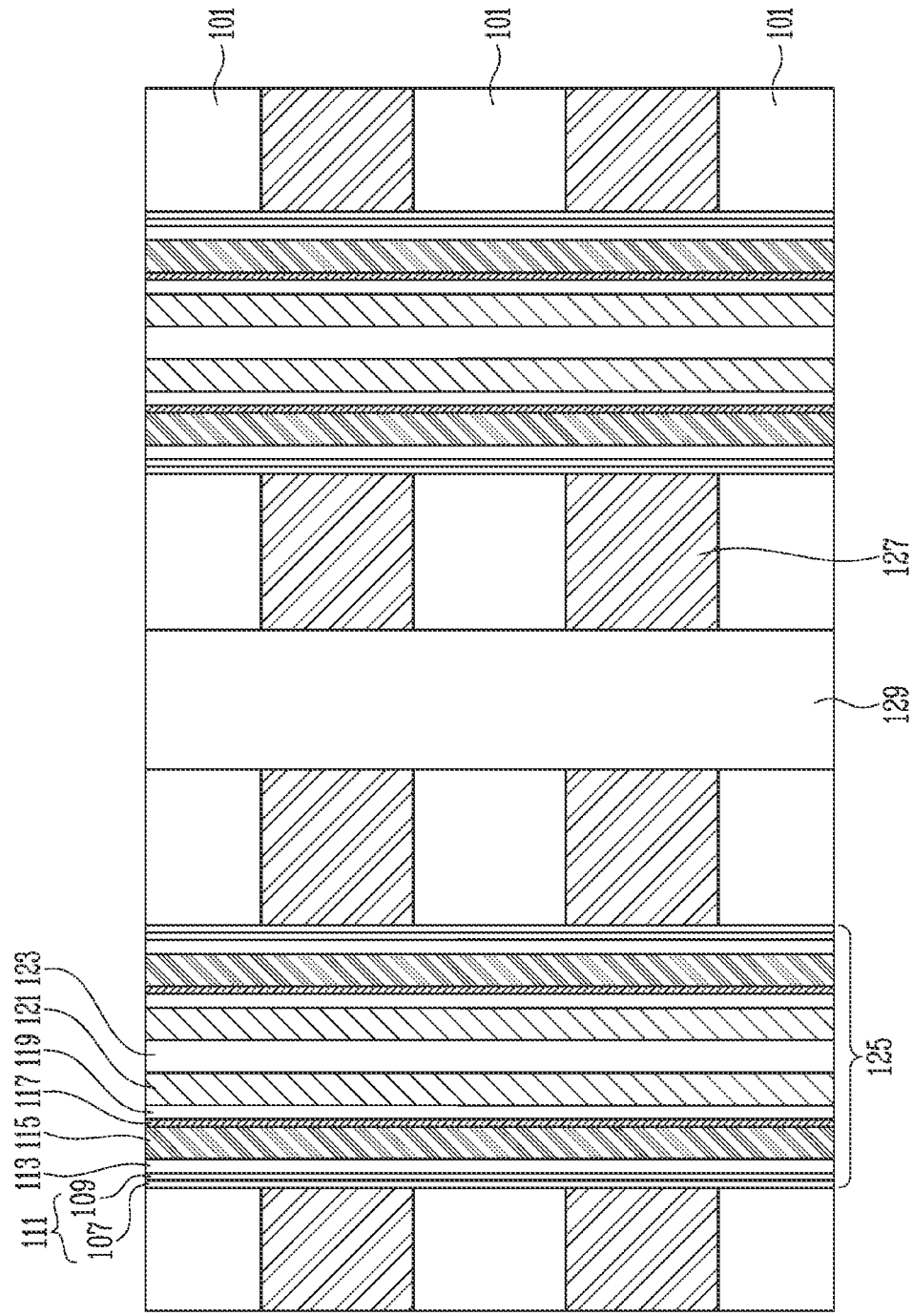

Referring to FIG. 6D, spaces from which the sacrificial layers are removed may be filled with a gate electrode 127, For example, a conductive material in the slit may be removed from the slit and deposited into the gate electrodes 127 such that the openings are filled therewith. Subsequently, a vertical structure 129 is formed by filling the slit with an insulating material.

Figure 7:
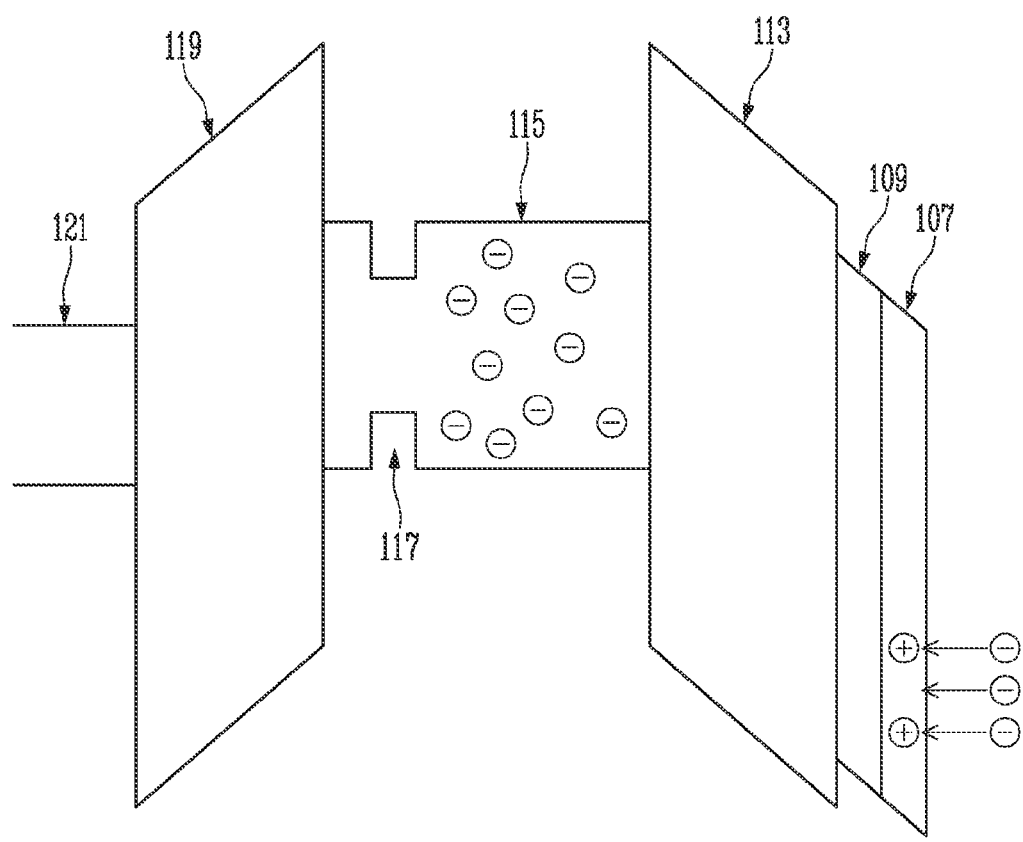
FIG. 7 is an energy band gap diagram of a memory cell in accordance with an embodiment of the present disclosure.

FIG. 7 is an energy band gap diagram of a memory cell in accordance with an embodiment of the present disclosure.

The channel layer 121, the tunnel insulating layer 119, the emission preventing layer 117, the charge storage layer 115, the blocking insulating layer 113, and the compensation charge storage layer 111, which are described in FIG. 5, nay operate as one memory cell.

When a program voltage having a high potential level is applied to a gate of the memory cell in a program operation, charges in the channel layer 121 tunnel into the tunnel insulating layer 119 and may be trapped in the charge storage layer 115, Some charges among charges trapped in the charge storage layer 115 may be released within a limited time after a program voltage apply operation is completed.

The emission preventing layer 117 again may trap the charges released from the charge storage layer 115, to suppress the charges from being emitted to the outside of the semiconductor memory device. Thus, a threshold voltage of the memory cell may be uniformly maintained.

A trap site may exist at the inside of the second layer 107 of the compensation storage layer. The trap site may be formed at an edge portion of a balance band of the second layer 107. The trap site of the second layer 107 becomes empty in the program voltage apply operation. Subsequently, charges may be introduced from a gate electrode to be trapped in another operation except the program voltage apply operation. Thus, although some charges among the charges trapped in the charge storage layer 115 are emitted to the outside of the semiconductor memory device, the threshold voltage of the memory cell may be constantly maintained by the charges trapped in the second layer 107.

Figure 8:
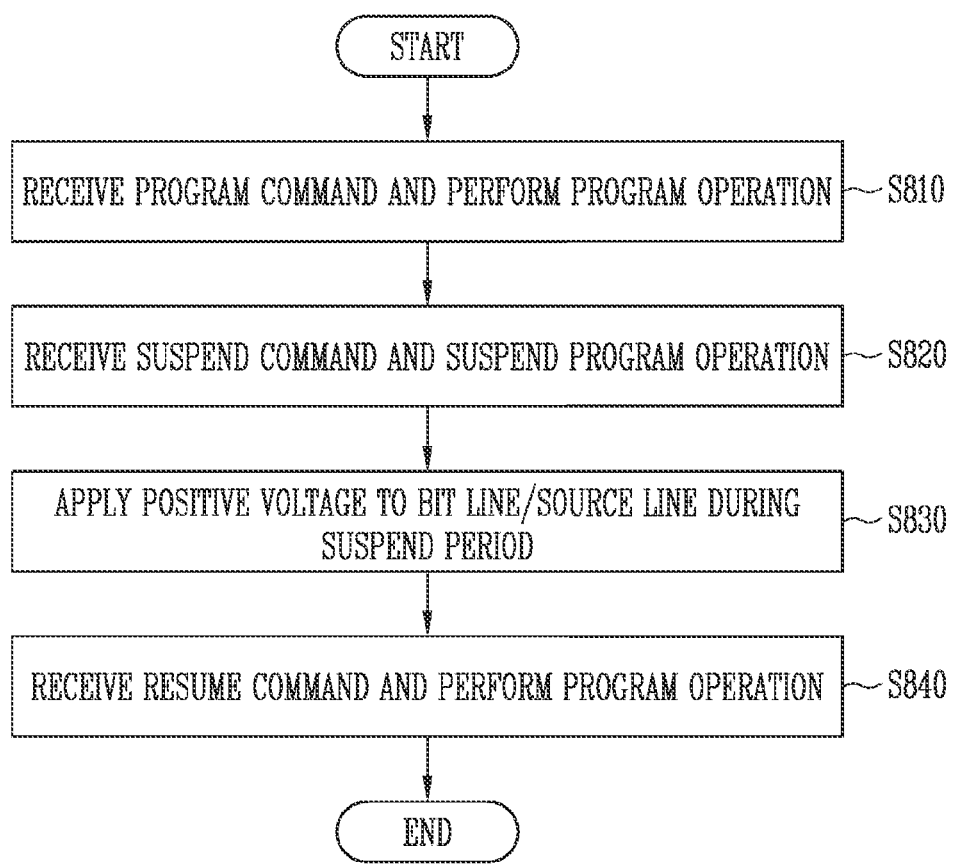
FIG. 8 is a flowchart illustrating a method of operating a semiconductor memory device in accordance with an embodiment of the present disclosure.

FIG. 8 is a flowchart illustrating a method of operating a semiconductor memory device in accordance with an embodiment of the present disclosure.

Figure 9:
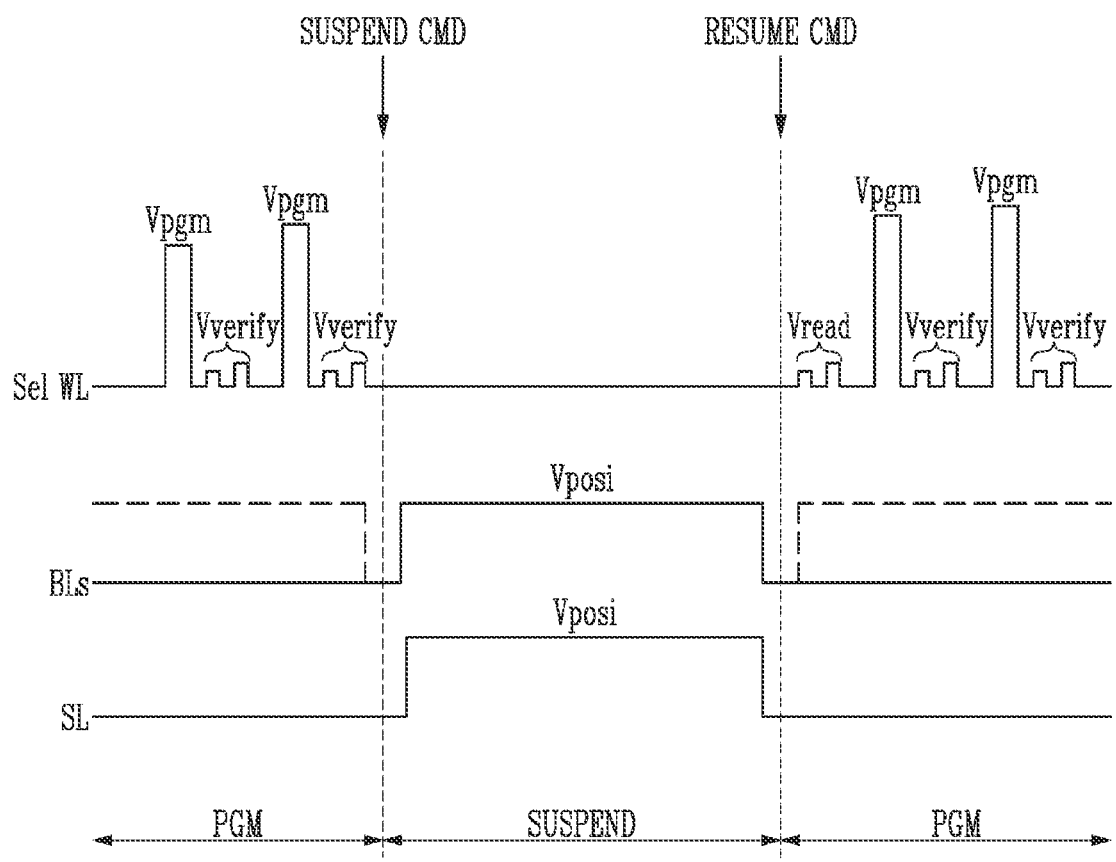
FIG. 9 is a waveform diagram of voltages, illustrating voltages in accordance with the method shown in FIG. 8.

FIG. 9 is a waveform diagram of voltages that illustrates the method shown in FIG. 8.

The method of operating the semiconductor memory device in accordance with an embodiment of the present disclosure will be described as follows with reference to FIGS. 1, 2, 4, 5, and 7 to 9.

In step S810, the control circuit 35 of the semiconductor memory device 10 may receive, from outside the semiconductor memory device, a command corresponding to a program operation, i.e., a program command CMD and an address ADD, and the peripheral circuit PC of the semiconductor memory device 10 may perform the program operation in response to the program command CMD and the address ADD.

A program operation period PGM may include a program voltage apply operation and a verify operation, which may be alternately performed.

In the program voltage apply operation, the page buffer group 37 may apply a program allow voltage (e.g., 0V) or a program inhibit voltage (e.g., a power voltage) to bit lines BLs according to data to be programmed.

The voltage generator 31 may generate a program voltage Vpgm and a pass voltage under the control of the control logic 35, and the row decoder 33 may apply the program voltage Vpgm generated by the voltage generator 31 to a selected word line Sel WL. The row decoder 33 may apply the pass voltage to unselected word lines. Therefore, charges may be trapped in the charge storage layer 115 of memory cells connected to the selected word line Sel WL.

In the verify operation, the voltage generator 31 may generate at least one verify voltage Vverify under the control of the control circuit 35, and the row decoder 33 may apply the verify voltage Vverify generated by the voltage generator 31 to the selected word line Sel WL. The row decoder 33 may apply the pass voltage to the unselected word lines.

The page buffer group 37 may sense a potential level or current amount of the bit lines BLs, and may apply the program allow voltage (e.g., 0V) or the program inhibit voltage (e.g., the power voltage), based on a sensing result.

In step S820, the semiconductor memory device 10 may receive a suspend command SUSPEND CMD from outside of the semiconductor memory device. The peripheral circuit PC may suspend an operation being performed currently, i.e., the program operation in response to the suspend command SUSPEND CMD. Therefore, the peripheral circuit PC may block the program voltage Vpgm or the verify voltage Vverify, which may be applied to the selected word line Sel WL, and may control the selected word line Sel WL to have a ground level. Accordingly, charges may be trapped in the compensation charge storage layer 111 of the memory cell.

The suspend command SUSPEND CMD may be received from outside of the semiconductor memory device, when the performance of an urgent operation is required. For example, when the performance of an urgent operation is required, the suspend command SUSPEND CMD may be received to suspend the program operation being performed currently, and then, a command corresponding to the urgent operation may be received.

In step S830, the semiconductor memory device 10 may receive the suspend command SUSPEND CMD from outside of the semiconductor memory device. In a suspend operation period SUSPEND in which the program operation may be suspended, the peripheral circuit PC may apply a positive voltage Vposi to the bit lines BLs, a source line SL, or the bit lines BLs and the source line SL. Therefore, a potential level of the channel layer 121 of the memory cells may be increased, and accordingly, the charges trapped in the charge storage layer 115 may be suppressed from being emitted to outside of the semiconductor device.

In addition, the emission preventing layer 117 of the memory cell may trap charges released from the charge storage layer 115. Thus, a threshold voltage of the memory cell may be prevented from being decreased.

In step S840, the semiconductor memory device 10 may receive a resume command RESUME CMD from the outside. The resume command RESUME CMD may be a command for ending the suspend operation period SUSPEND and re-performing the suspended program operation. The peripheral circuit PC may re-perform the suspended program operation in response to the resume command RESUME CMD.

The peripheral circuit PC may perform a read operation to determine a threshold voltage of the memory cells connected to the selected word line Sel WL. For example, the voltage generator 31 may generate at least one read voltage Vread under the control of the control logic 35, and the row decoder 33 may apply the read voltage Vread generated by the voltage generator 31 to the selected word line Sel WL. The row decoder 33 may apply the pass voltage to the unselected word lines.

The page buffer group 37 may sense a potential level or current amount of the bit lines BLs, and may determine the threshold voltage of the memory cells, based on a sensing result.

Subsequently, the peripheral circuit PC may re-perform the program voltage apply operation and the verify operation, which are described above.

Figure 10:
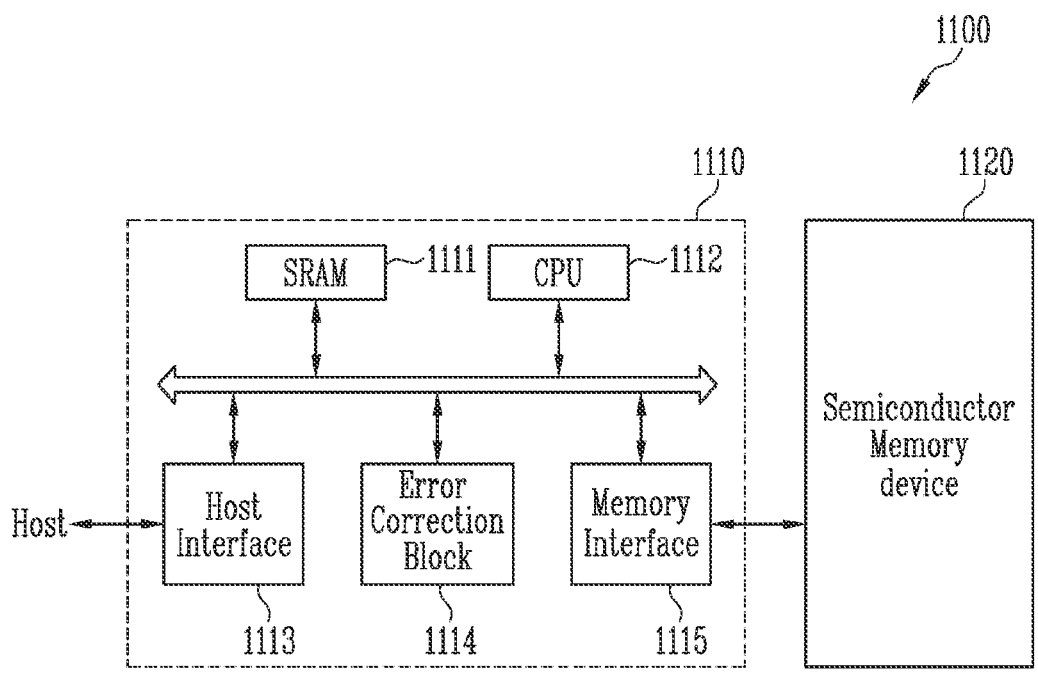
FIG. 10 is a block diagram illustrating a configuration of a memory system in accordance with an embodiment of the present disclosure.

FIG. 10 is a block diagram illustrating a configuration of a memory system 1100 in accordance with an embodiment of the present disclosure.

Referring to FIG. 10, the memory system 1100 may include a semiconductor memory device 1120 and a memory controller 1110.

The semiconductor memory device 1120 may include a plurality of channel structures penetrating a stack structure in which a plurality of interlayer insulating layers and a plurality of gate electrodes may be alternately stacked. Each of the plurality of channel structures may include a compensation charge storage layer, a blocking insulating layer, a charge storage layer, an emission preventing layer, a tunnel insulating layer, and a channel layer. The semiconductor memory device 1120 may be configured identically to the semiconductor memory device shown in FIG. 4.

The semiconductor memory device 1120 may be a multi-chip package configured with a plurality of flash memory chips.

The memory controller 1110 may control the semiconductor memory device 1120, and may include a Static Random Access Memory (SRAM) 1111, a Central Processing Unit (CPU) 1112, a host interface 1113, an error correction block 1114, and a memory interface 1115. The SRAM 1111 may be used as an operation memory of the CPU 1112, the CPU 1112 may perform overall control operations for data exchange of the memory controller 1110, and the host interface 1113 may include a data exchange protocol for a host connected with the memory system 1100. The error correction block 1114 may detect and correct an error included in a data read from the semiconductor memory device 1120, The memory interface 1115 may interface with the semiconductor memory device 1120, The memory controller 1110 may further include a Read Only Memory (ROM) for storing code data for interfacing with the host, and the like.

Figure 11:
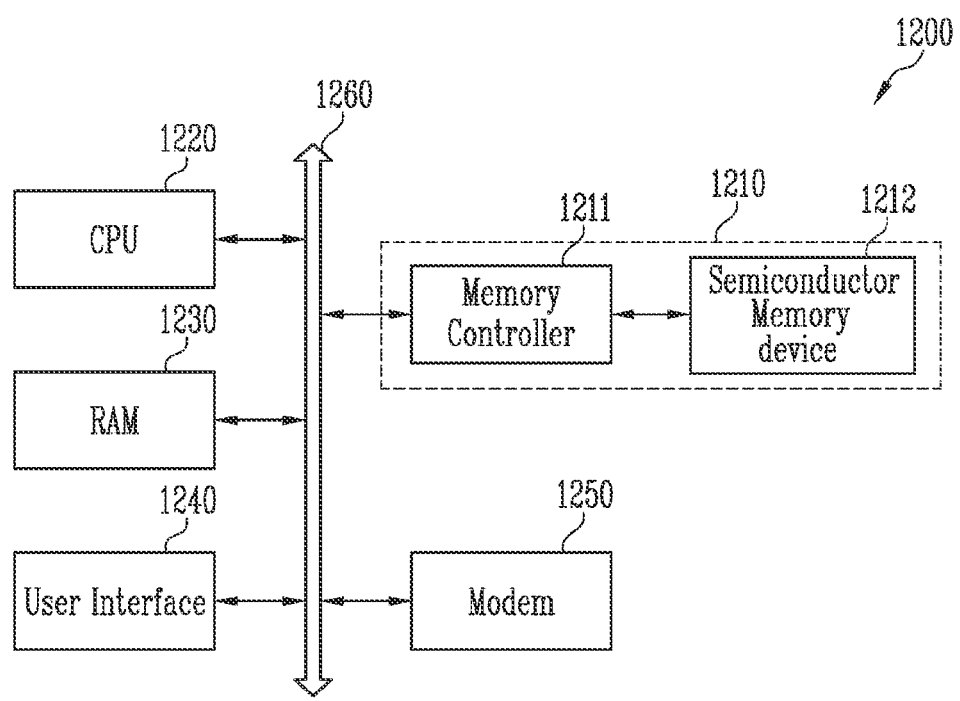
FIG. 11 is a block diagram illustrating a configuration of a computing system in accordance with an embodiment of the present disclosure.

FIG. 11 is a block diagram illustrating a configuration of a computing system in accordance with an embodiment of the present disclosure.

Referring to FIG. 11, the computing system 1200 in accordance with the embodiment of the present disclosure may include a CPU 1220, a random access memory (RAM) 1230, a user interface 1240, a modem 1250, and a memory system 1210, which are electrically connected to a system bus 1260. The computing system 1200 may be a mobile device.

The memory system 1210 may include a semiconductor memory device 1212 and a memory controller 1211. The semiconductor memory device 1212 may include a plurality of channel structures penetrating a stack structure in which a plurality of interlayer insulating layers and a plurality of gate electrodes are alternately stacked. Each of the plurality of channel structures may include a compensation charge storage layer, a blocking insulating layer, a charge storage layer, an emission preventing layer, a tunnel insulating layer, and a channel layer. The semiconductor memory device 1212 may be configured identically to the semiconductor memory device shown in FIG. 4.

In accordance with the present disclosure, charges trapped in a charge storage layer of a memory cell may be suppressed from being released in a program operation of the semiconductor memory device, so that the threshold voltage distribution of memory cells may be improved.

While the present disclosure has been shown and described with reference to certain exemplary embodiments thereof, it will be understood by those skilled in the art that various changes in form and Li) details may be made therein without departing from the spirit and scope of the present disclosure as defined by the appended claims and their equivalents, Therefore, the scope of the present disclosure should not be limited to the above-described exemplary embodiments but should be determined by only the appended claims and the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications may be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications may be made on the basis of the technological scope of the present disclosure in addition to the embodiments disclosed herein.

What is claimed is:

1. A method of manufacturing a semiconductor memory device, the method comprising:
    forming a stack structure by alternately stacking a plurality of interlayer insulating layer and a plurality of sacrificial layers on a substrate;
    forming a plurality of holes penetrating the stack structure in a vertical direction; and
    sequentially forming a blocking insulating layer, a charge storage layer, an emission preventing layer, a tunnel insulating layer, and a channel layer on a sideman of each of the plurality of holes.

2. The method of claim 1, wherein the emission preventing layer is formed as a quantum dot monolayer.

3. The method of claim 1, wherein the emission preventing layer is formed as a metal silicide layer.

4. The method of claim 3, wherein the metal silicide layer is formed by sequentially depositing a tungsten thin film and a silicon thin film on a sidewall of the charge storage layer and then performing a metal heat treatment process.

5. The method of claim 3, wherein the metal silicide layer is formed by depositing a tungsten silicide layer on a sidewall of the charge storage layer through a CVD or ALD process and then performing a metal heat treatment process.

6. The method of claim 1, wherein the emission preventing layer is formed as a silicon layer.

7. The method of claim 6, wherein the silicon layer is formed by forming an $SiO_2$ layer or an SiON layer on the sidewall of the charge storage layer and then performing a metal heat treatment process (RTA) under an $N_2$ atmosphere.

8. The method of claim 1, further comprising forming a compensation charge storage layer on a sidewall of each of the plurality of holes before the blocking insulating layer is formed.

9. The method of claim 8, wherein the compensation charge storage layer is formed as a multi-layer, and at least one layer included in the multi-layer forms a trap.

10. The method of claim 9, wherein the at least one layer is formed as $Al_2O_3$, and a trap is formed through a redox mechanism by adjusting a composition ratio of Al and O.

11. The method of claim 8, wherein the compensation charge storage layer includes a layer including at least one of $Al_2O_3$, HfO, ZrO, $Ta_2O_3$, HfTaxOy, LaHfO, and HfSiO.

* * * * *